(12) United States Patent
Fan

(10) Patent No.: US 10,793,247 B2
(45) Date of Patent: Oct. 6, 2020

(54) ENCLOSURE FOR STORING ELECTRONIC COMPONENTS IN OVERHEAD SPACE OF AN AIRCRAFT

(71) Applicant: THE BOEING COMPANY, Chicago, IL (US)

(72) Inventor: Daniel Fan, Renton, WA (US)

(73) Assignee: THE BOEING COMPANY, Chicago, IL (US)

( * ) Notice: Subject to any disclaimer, the term of this patent is extended or adjusted under 35 U.S.C. 154(b) by 328 days.

(21) Appl. No.: 15/968,368

(22) Filed: May 1, 2018

(65) Prior Publication Data

US 2019/0337603 A1 Nov. 7, 2019

(51) Int. Cl.
| | |
|---|---|
| *B64D 1/00* | (2006.01) |
| *B64C 1/00* | (2006.01) |
| *B64D 11/00* | (2006.01) |
| *H05K 7/20* | (2006.01) |
| *H05K 7/14* | (2006.01) |
| *H05K 7/18* | (2006.01) |

(52) U.S. Cl.
CPC ............. *B64C 1/00* (2013.01); *B64D 11/003* (2013.01); *H05K 7/1489* (2013.01); *H05K 7/183* (2013.01); *H05K 7/20545* (2013.01); *H05K 7/20709* (2013.01)

(58) Field of Classification Search
CPC . B64C 1/00; B64D 11/003; B64D 2011/0046; B64D 2011/0076; B64D 2011/0084
See application file for complete search history.

(56) References Cited

U.S. PATENT DOCUMENTS

| | | | | |
|---|---|---|---|---|
| 4,066,227 A | * | 1/1978 | Buchsel | B64D 11/00 105/340 |
| 6,464,169 B1 | * | 10/2002 | Johnson | B64D 11/00 244/118.5 |
| 9,308,995 B2 | * | 4/2016 | Spellman | B64D 11/00 |
| 2010/0019087 A1 | * | 1/2010 | Warner | B64D 11/003 244/118.6 |
| 2012/0160961 A1 | * | 6/2012 | Curry | B64D 9/00 244/118.1 |

* cited by examiner

*Primary Examiner* — Richard G Davis
(74) *Attorney, Agent, or Firm* — Moore IP Law

(57) ABSTRACT

An aircraft includes an enclosure positioned in a crown of the aircraft and extending in a direction parallel to a longitudinal axis of the aircraft. The crown is above a passenger cabin of the aircraft. The aircraft includes an equipment rack coupled to a first side of the enclosure. The equipment rack is configured to hold at least one electronic component. The aircraft further includes an entryway on a second side of the enclosure that is opposite to the first side. The entryway provides access to the enclosure from the passenger cabin.

20 Claims, 12 Drawing Sheets

900 

902

Access an enclosure positioned in a crown of an aircraft and extending in a direction parallel to a longitudinal axis of the aircraft, the crown being above a passenger cabin of the aircraft, the enclosure having an equipment rack coupled to a first side of the enclosure, the equipment rack storing an electronic component, the enclosure further having an entryway on a second side of the enclosure that is opposite to the first side, the entryway providing access to the enclosure from the passenger cabin

904

Remove the electronic component from the equipment rack

1002

Access an enclosure positioned in a crown of an aircraft and extending in a direction parallel to a longitudinal axis of the aircraft, the crown being above a passenger cabin of the aircraft, the enclosure having an equipment rack coupled to a first side of the enclosure, the enclosure further having an entryway on a second side of the enclosure that is opposite to the first side, the entryway providing access to the enclosure from the passenger cabin

1004

Install an electronic component within the equipment rack

*FIG. 10*

ENCLOSURE FOR STORING ELECTRONIC COMPONENTS IN OVERHEAD SPACE OF AN AIRCRAFT

FIELD OF THE DISCLOSURE

The present disclosure is generally related to an enclosure for utilizing space within an aircraft.

BACKGROUND

Improvements in technology have led to an increased number of electronics and avionics onboard an aircraft. For example, various sensors, electronic controllers, and other electronic components can be used by pilots to fly the aircraft or to record information during a flight. Additionally, passengers have come to expect increasingly sophisticated entertainment systems onboard aircrafts. As the number of electronic components onboard aircrafts increases, storing the electronic components becomes challenging. Electronic components are typically stored in an electronic and equipment bay at the front of the aircraft, often behind panels or otherwise hidden from view of the passengers. However, storing the electronic components in this manner uses valuable space in the passenger cabin or below the passenger cabin that could otherwise be used for seating, walkways, a galley, restrooms, storage space, or in other ways that can improve the passengers' experience. Additionally, some components, such as entertainment systems that are integrated in or coupled to the seats, are located throughout the aircraft. It can take significant amounts of wiring to connect the many components throughout the aircraft to the electronic components at the front of the aircraft. Additionally, many components are connected to antennas, which are commonly mounted on a surface of the aircraft, thereby requiring additional wiring. Such wiring is costly to install and maintain and adds to the weight of the aircraft. Additionally, some electronic and avionics components require cooling, and therefore cannot be located in non-climate-controlled areas of the aircraft.

SUMMARY

In a particular implementation, an aircraft includes an enclosure positioned in a crown of the aircraft and extending in a direction parallel to a longitudinal axis of the aircraft. The crown is above a passenger cabin of the aircraft. The aircraft includes an equipment rack coupled to a first side of the enclosure. The equipment rack is configured to hold at least one electronic component. The aircraft further includes an entryway on a second side of the enclosure that is opposite to the first side. The entryway provides access to the enclosure from the passenger cabin.

In another particular implementation, a method includes accessing an enclosure positioned in a crown of an aircraft and extending in a direction parallel to a longitudinal axis of the aircraft. The crown is above a passenger cabin of the aircraft. The enclosure has an equipment rack coupled to a first side of the enclosure. The equipment rack stores an electronic component. The enclosure further has an entryway on a second side of the enclosure that is opposite to the first side. The entryway provides access to the enclosure from the passenger cabin. The method also includes removing the electronic component from the equipment rack.

In another particular implementation, a method includes accessing an enclosure positioned in a crown of an aircraft and extending in a direction parallel to a longitudinal axis of the aircraft. The crown is above a passenger cabin of the aircraft. The enclosure has an equipment rack coupled to a first side of the enclosure. The enclosure further has an entryway on a second side of the enclosure that is opposite to the first side. The entryway provides access to the enclosure from the passenger cabin. The method also includes installing an electronic component within the equipment rack.

BRIEF DESCRIPTION OF THE DRAWINGS

FIG. 9 is a flow chart of an example of a method of removing an electronic component from the enclosure of FIG. 1;

FIG. 10 is a flow chart of an example of a method of installing an electronic component within the enclosure of FIG. 1;

DETAILED DESCRIPTION

Figure 1:
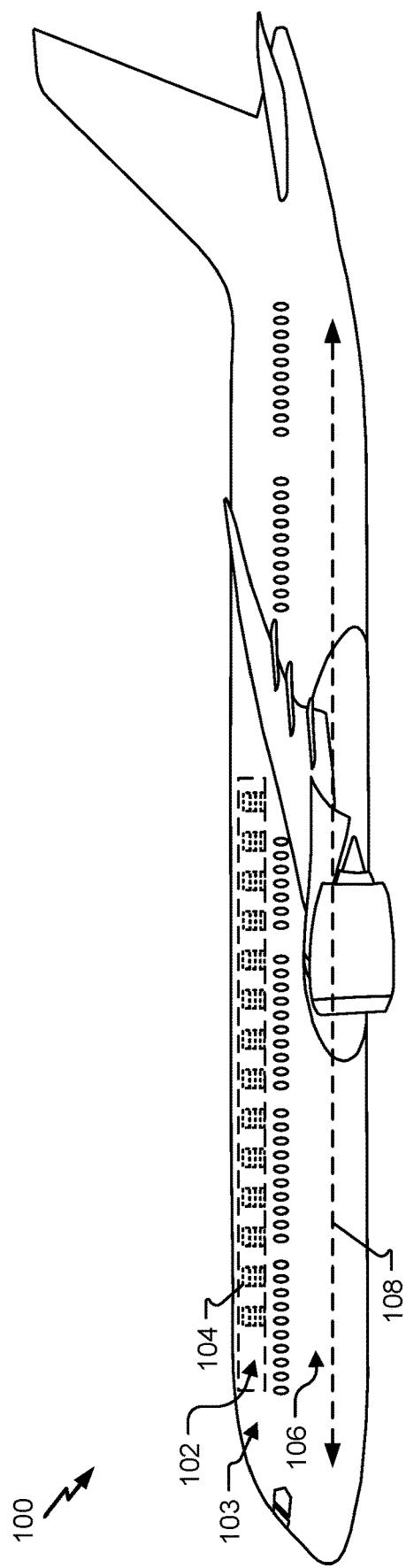
FIG. 1 is a block diagram that illustrates a particular implementation of an aircraft that includes an enclosure storing an equipment rack for electronic component storage.

Particular implementations are described with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. Further, the terms "comprise," "comprises," and "comprising" are used interchangeably with "include," "includes," or "including." Additionally, it will be understood that the term "wherein" is be used interchangeably with "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating", "calculating", "using", "selecting", "accessing", and "determining" are interchangeable unless content indicates otherwise. For example, "generating", "calculating", or "determining" a parameter (or a signal) can refer to actively generating, calculating, or determining the parameter (or the signal) or can refer to using, selecting, or accessing the parameter (or signal) that is already generated, such as by another component or device. Additionally, "adjusting" and "modifying" can be used interchangeably. For example, "adjusting" or "modifying" a parameter can refer to changing the parameter from a first value to a second value (a "modified value" or an "adjusted value"). As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components.

Implementations disclosed herein devices and methods for efficiently utilizing overhead space in an aircraft to store electronic and avionics components. For example, an enclosure (e.g., a structure) can be located in a crown of an aircraft, above a passenger cabin. Overhead space in the aircraft is typically used to provide overhead luggage compartments as well as support for components such as reading lights, fans, indicators, etc. However, the overhead luggage compartments and other components only use a portion of the overhead space, resulting in inefficient use of a totality of the space available on an aircraft. By locating the enclosure within the overhead space above the passenger cabin, the overhead space is used more efficiently.

The enclosure stores at least one equipment rack that houses at least one electronic component or avionics component. The enclosure is a structure that extends in a direction parallel to a longitudinal axis of the aircraft and that is located above the passenger cabin. In a particular implementation, the enclosure includes one or more equipment racks that are fixed to a first side of the enclosure. The one or more equipment racks can include standardized, modular equipment racks that are configured to hold electronic components. In a particular implementation, an entryway is coupled to a second side of the enclosure and provides access to the enclosure from the passenger cabin.

Electronic components, as described in more detail below, include any electrical device, computer, processor, information processing device, transmitter, receiver, transceiver, avionics, and the like.

Because the enclosure is located above the passenger cabin, the enclosure is pressurized similar to the passenger cabin. Additionally, one or more environmental control system (ECS) vents are coupled to the enclosure and configured to provide cool air to the enclosure, the vent warm air from the enclosure, or both. Thus, the enclosure can be used as a climate-controlled (e.g., pressurized and air-conditioned) overhead electronics compartment that is accessible from the passenger cabin before, during, and after flight.

In at least some implementations, the enclosure includes a first rail coupled to an exterior of the first side of the enclosure and a second rail coupled to an exterior of the second side of the enclosures. The two rails extend along the enclosure (e.g., parallel to the longitudinal axis of the aircraft). In these implementations, the first rail is coupled to a hull of the aircraft by a first set of coupling members and the second rail is coupled to the hull by a second set of coupling members. By coupling the enclosure to the hull using the two sets of coupling members, the enclosure can be supported in an area above the passenger cabin of the aircraft that would otherwise typically be unused, or used mainly for routing wiring and ducts across the aircraft. A technical effect of embodiments herein includes increased space in the passenger cabin.

A technical effect of locating avionics and electronics components within the enclosure is that a reduced amount of wiring can be used to connect the components to other systems or components. For example, because the enclosure is located in the crown of the aircraft, the electronic components are closer to antennas located on top of the aircraft, thus, less wiring (and less complex routing) can be used to connect the avionics and electronics components to the antenna. Additionally, because the enclosure is above the passenger cabin (and extends above the seats), electronic components that support entertainment systems in the passenger cabin can be located above the corresponding entertainment systems. This reduces an amount of wiring used (and thus an overall weight of the aircraft), a complexity of routing the wiring, or both, used to connect the electronics components to the corresponding entertainment systems, as compared to storing the electronics components in a bay at the front of the aircraft or in the cargo hold.

FIG. 1 illustrates an example of a particular implementation of an aircraft 100 that includes overhead storage for electronic components. The aircraft 100 includes an enclosure 102 positioned in a crown 103 of the aircraft 100. The "crown" 103 of the aircraft 100 refers to a region located in an upper lobe of the aircraft 100, above a passenger cabin 106 of the aircraft 100 with respect to the orientation illustrated in FIG. 1. It should be noted that references herein to "up", "down", "above", "below", or "top" are made with respect to the orientation illustrated in FIG. 1 and are made for convenience of description and not with respect to any external frame of reference or required orientation. In a particular implementation, the enclosure 102 is a substantially rectangular tubular structure that is located above the passenger cabin 106. The enclosure 102 can be made of metal, plastic, laminate, a composite material, another material, or a combination thereof. The passenger cabin 106 includes seats, aisles, overhead storage bins, or a combination thereof, as further described herein.

The enclosure 102 extends in a direction parallel to a longitudinal axis 108 (e.g., a roll axis) of the aircraft 100. As illustrated in FIG. 1, the longitudinal axis 108 extends in the direction of the nose of the aircraft 100 and in the direction of the tail of the aircraft 100 (e.g., from front to back along a length of the aircraft 100 in the orientation illustrated in FIG. 1). The longitudinal axis 108 is perpendicular to a lateral axis (e.g., a pitch axis). In the example of FIG. 1, the enclosure 102 extends from the front of the aircraft 100 (e.g., nose) toward the back (e.g., the tail) of the aircraft 100 in a direction parallel to the longitudinal axis 108. Although the enclosure 102 is illustrated as only extending along a portion of the passenger cabin 106, in some implementations, the enclosure 102 extends across an entirety of the passenger cabin 106. In other implementations, the enclosure 102 extends across only a portion of the passenger cabin 106.

The enclosure 102 includes an equipment rack, such as illustrative equipment rack 104. The equipment rack 104 is configured to hold at least one electronic component, such as components of electronic systems or avionics systems. In some implementations, the enclosure 102 includes multiple equipment racks extending along a length of the enclosure 102. In some implementations, the equipment racks are located above other components in the passenger cabin 106, such as entertainment systems, to which the components within the equipment racks are coupled. For example, a particular equipment rack that includes a first component of an entertainment system can be located above a second component of the entertainment system within the passenger cabin 106. Locating the equipment racks (and components) above other components within the passenger cabin 106 which are coupled to the components reduces the length and complexity of wiring within the aircraft 100.

In a particular implementation, the electronic and avionics components are installed in the equipment rack 104 prior to installation within the enclosure 102. Alternatively, electronic and avionics components can be stored in or removed from the equipment rack 104 during service, maintenance, or operation of the aircraft 100. For example, the enclosure 102 can be accessed via an entryway described further herein. In particular examples, the entryway provides access from the passenger cabin 106 to the enclosure 102. Thus, the enclosure 102 can be accessed to add, remove, configure, or reconfigure one or more electronic or avionics components stored in the equipment rack 104.

Storage of the electronic components in the enclosure 102 enables more efficiently use of space onboard the aircraft 100 and can free up additional space (e.g., an electronic and equipment bay) in the passenger cabin 106 that would otherwise be used to store electronics and avionics components. The additional room can be used to increase the number of passengers serviced, or the amount of luggage stored in the passenger cabin 106, or to provide space for other uses, such as a galley, restrooms, etc. Additionally, some electronic components can be stored closer to other electronic components they are coupled to, such as entertainment systems, which can reduce the amount of wiring and the complexity of routing of wiring onboard the aircraft 100.

Figure 2:
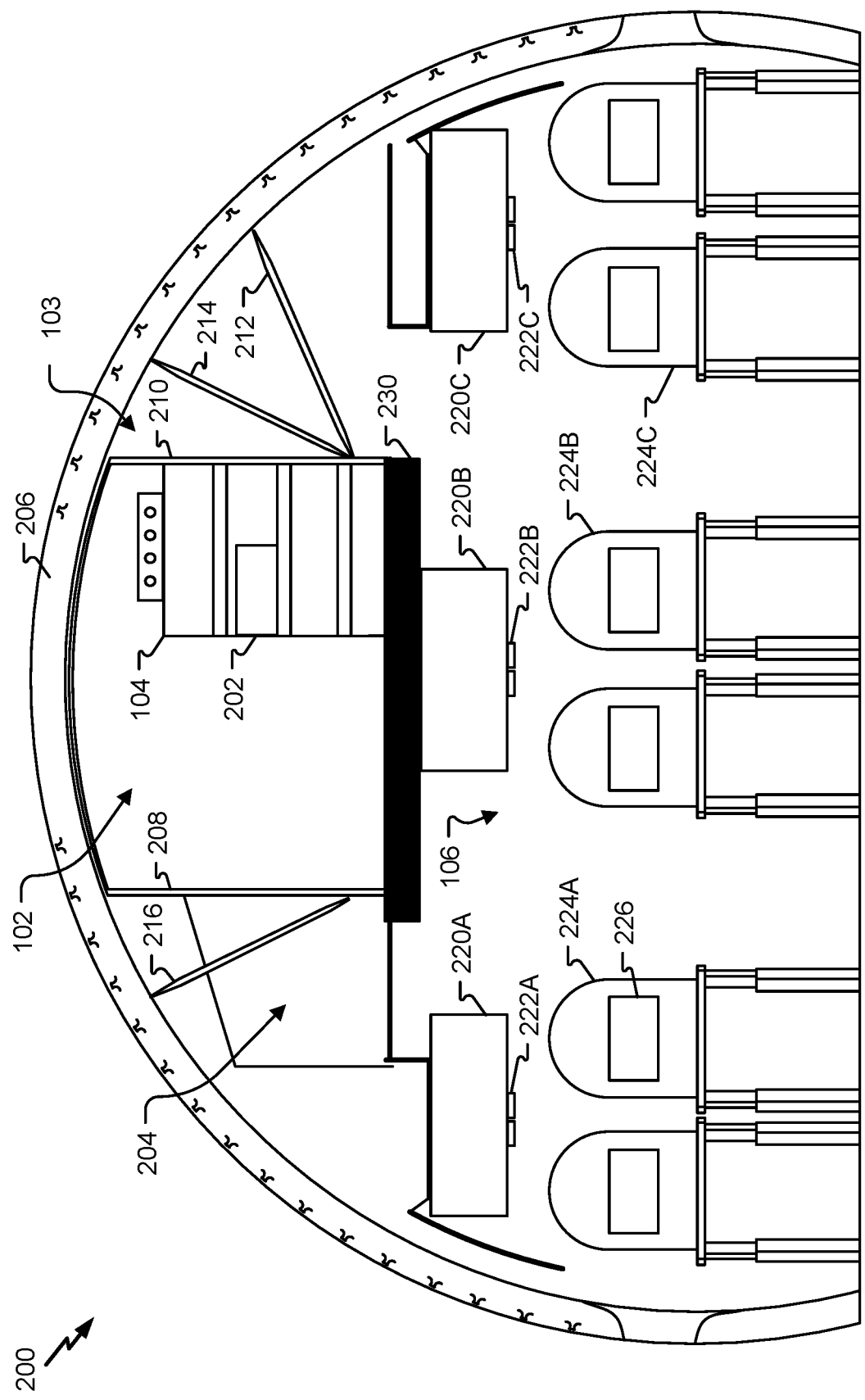
FIG. 2 illustrates a first view of the aircraft of FIG. 1.

Referring to FIG. 2, a view 200 of the aircraft 100 is shown. In a particular implementation, the view 200 is illustrated facing toward the nose of the aircraft 100. As described with reference to FIG. 1, the aircraft 100 includes the enclosure 102 and the passenger cabin 106.

The enclosure 102 is positioned in the crown 103 of the aircraft 100. For example, the enclosure 102 is located in an upper lobe of the aircraft 100, above the passenger cabin 106. As described with reference to FIG. 1, the enclosure 102 extends in a direction perpendicular to the longitudinal axis 108 of the aircraft 100. Although not illustrated, each end of the enclosure 102 can be sealed such that the enclosure 102 is a substantially rectangular tubular structure having two closed ends.

The enclosure 102 is coupled to a fuselage 206 of the aircraft 100. For example, in FIG. 2, the enclosure 102 is coupled to the fuselage 206 via a first set of coupling members that are pivotably coupled to the enclosure 102 and a second set of coupling members that are pivotably coupled to the enclosure 102, as further described with reference to FIG. 3. The first set of coupling members includes a first coupling member 212 and a second coupling member 214, and the second set of coupling members includes a third coupling member 216.

Figure 4:
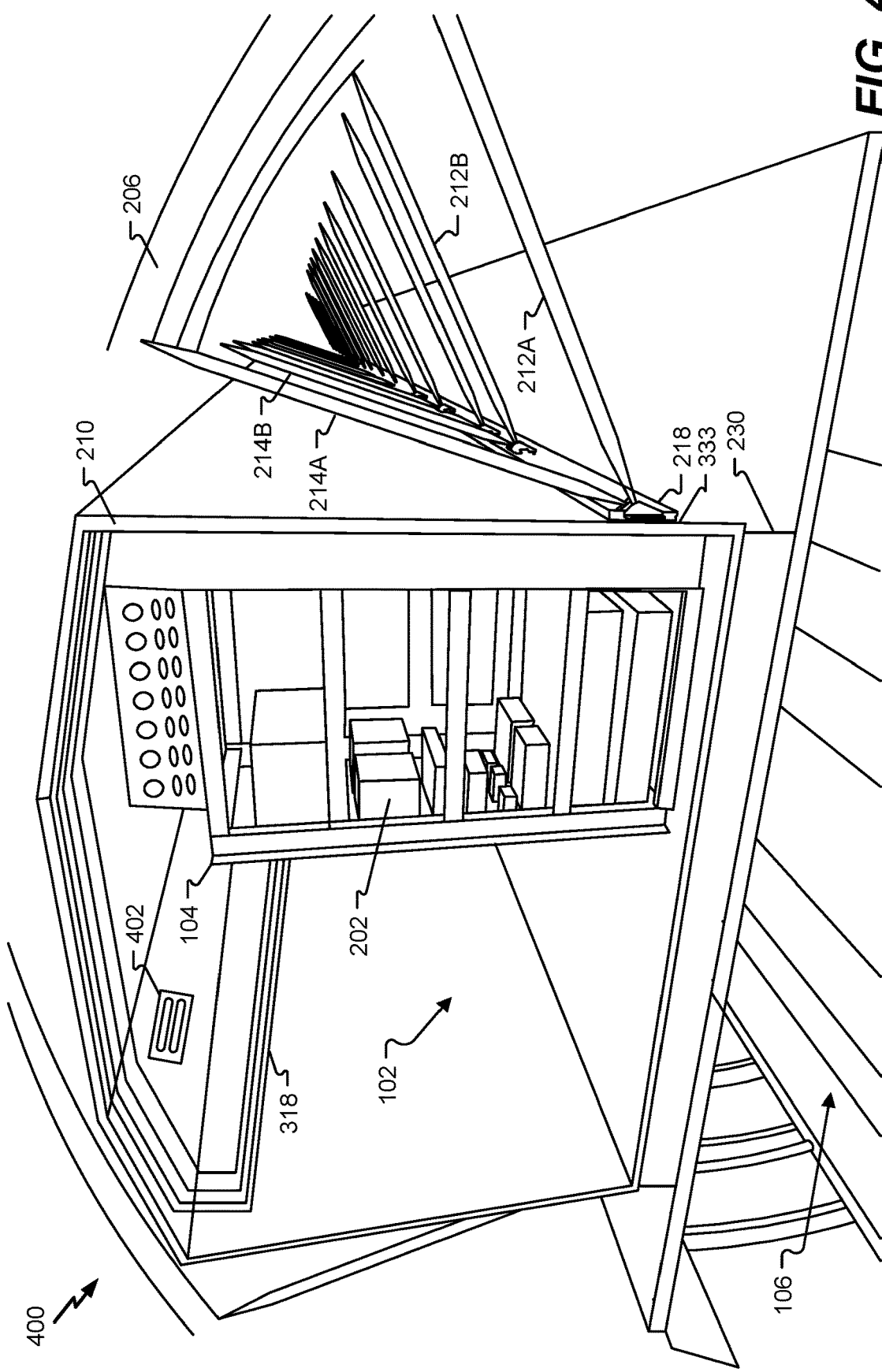
FIG. 4 illustrates a second view of the enclosure of FIG. 1.

The enclosure 102 is located within a pressurized area of the aircraft 100, and the enclosure 102 itself is pressurized. In some implementations, the enclosure 102 includes one or more environmental control system (ECS) vents configured to deliver air to the enclosure 102, as illustrated in FIG. 4. Thus, the enclosure 102 can serve as a pressurized and climate-controlled storage bay for electronics and avionics components.

In FIG. 2, the enclosure 102 includes the equipment rack 104. The equipment rack 104 is configured to store at least one electronic component, such as illustrative electronic component 202. The electronic component 202 can be any component of an electronics system or avionics system onboard the aircraft 100. For example, the electronic component 202 can include one or more avionics systems configured to record information (e.g., altitude, airspeed, location, time, temperature, other measurements, or a combination thereof), communication systems (e.g., a transmitter, a receiver, a transceiver), entertainment systems (e.g., part of an in-flight entertainment system available to passengers in the passenger cabin 106), other components, or a combination thereof.

In a particular implementation, the equipment rack 104 is a modular equipment rack having a standardized size. For example, the enclosure 102 can include a plurality of equipment racks 104, each having the same size, and modular electronic components can be stored within the equipment racks 104. In some implementations, each electronic or avionics component have one or more specific sizes such that the components fit within the standardized equipment racks 104, and the particular components that are included are based on a type of the aircraft 100, a particular use of the aircraft 100, a particular mission or flight, other considerations, or a combination thereof. In some implementations, the equipment racks are loaded with the electronic and avionics components prior to being installed within the enclosure 102 (e.g., the equipment racks 104 come preloaded). In other implementations, the equipment racks 104 are installed within the enclosure 102 without any components, and the components are added afterward (e.g., prior to flight, during flight, or during service and maintenance between flights).

In the example illustrated in FIG. 2, the equipment rack 104 is coupled to a first side 210 of the enclosure 102. For example, the equipment rack 104 can be affixed to the first side 210 of the enclosure 102 using screws, brackets, bolts, pins, or some other means of affixing. Alternatively, the enclosure 102 can include one or more rails or other abutments, and the equipment rack 104 is coupled to the rails or other abutments using cords, rope, straps, clips, or another means. In some implementations, the equipment rack 104 is also coupled to a bottom of the enclosure 102. In this manner, the equipment rack 104 is fixedly coupled to the enclosure 102 such that the equipment rack 104 remains coupled, regardless of an orientation of the aircraft 100. Although the equipment rack 104 is coupled to the first side 210 of the enclosure 102 in the example illustrated in FIG. 2, in other implementations, additional equipment rack(s) are coupled to a second side 208 of the enclosure 102. Additionally, or alternatively, additional equipment rack(s) can be coupled to a third side or a fourth side of the enclosure 102 (e.g., a front side or a back side).

The aircraft 100 also includes an entryway 204 on the second side 208 of the enclosure 102. The second side 208 of the enclosure 102 is diametrically opposite to the first side 210 of the enclosure 102. The entryway 204 provides access to the enclosure 102 from the passenger cabin 106. For example, a crew member can access the enclosure 102 from the passenger cabin 106 via the entryway 204. The entryway 204 is described further with reference to FIG. 3. Although the entryway 204 is illustrated as being on the second side 208 of the enclosure 102 in FIG. 2, in other implementations, the entryway 204 is located at a different portion of the enclosure 102, such as along a third side (e.g., a front side) or a fourth side (e.g., a back side) of the enclosure 102. Thus, in some implementations, the entryway 204 is not opposite to the equipment rack 104.

In some implementations, the aircraft 100 includes a spacer panel 230 connected to a bottom of the enclosure 102. As illustrated in FIG. 2, the spacer panel 230 is positioned between the enclosure 102 and the passenger cabin 106. In a particular implementation, the spacer panel 230 is hollow and configured to enable one or more connectors (e.g., wires) to extend across a width (e.g., a lateral distance) of the enclosure 102. To illustrate, the spacer panel 230 can be a panel having a hollow interior that enables wires or other connectors to be routed across the width of the enclosure 102. The wires can be used to electrically couple the electronic component 202 to one or more components or systems within the passenger cabin 106. Additionally, the spacer panel 230 can support the ceiling of the passenger cabin 106 or structures coupled to the ceiling, such as overhead storage bins.

In the example illustrated in FIG. 2, the passenger cabin 106 includes seats 224A, 224B, and 224C. The seats 224A-C are separated by aisles. In the example illustrated in FIG. 2, seats 224A are separated from seats 224B by a first aisle, and seats 224B are separated from seats 224C by a second aisle. Although two aisles are shown, in other implementations, a single aisle or more than two aisles can be present in the passenger cabin 106. At least some of the seats 224 (or a ceiling of the passenger cabin 106) include an entertainment system, such as illustrative entertainment system 226. In the example illustrated in FIG. 2, the passenger cabin 106 also includes overhead storage bins, such as overhead storage bins 220A, 220B, and 220C. In a particular implementation, overhead storage bins 220A are located above the seats 224A, overhead storage bins 220B are located above the seats 224B, and overhead storage bins 220C are located above the seats 224C. In the example illustrated in FIG. 2, the passenger cabin 106 further includes one or more overhead components, such as overhead components 222A, 222B, and 222C. The overhead components 222A-C can include reading lights, fans, indicators (e.g., indicator lights), or a combination thereof.

Although three sets of seats 224, overhead storage bins 220, and overhead components 222 are illustrated, in other implementations, fewer than three or more than three sets can be included in the aircraft 100. Additionally, or alternatively, one or more of the overhead storage bins 220, the overhead components 222, or the seats 224 can be optional. In some implementations, the enclosure 102 is located above overhead storage bins, such as the overhead storage bins 220B in the middle of the aircraft 100, as illustrated in FIG. 2. In other implementations, the enclosure 102 is in place of at least some overhead storage bins, although side overhead storage bins (e.g., the overhead storage bins 220A and 220C) can remain.

Figure 3:
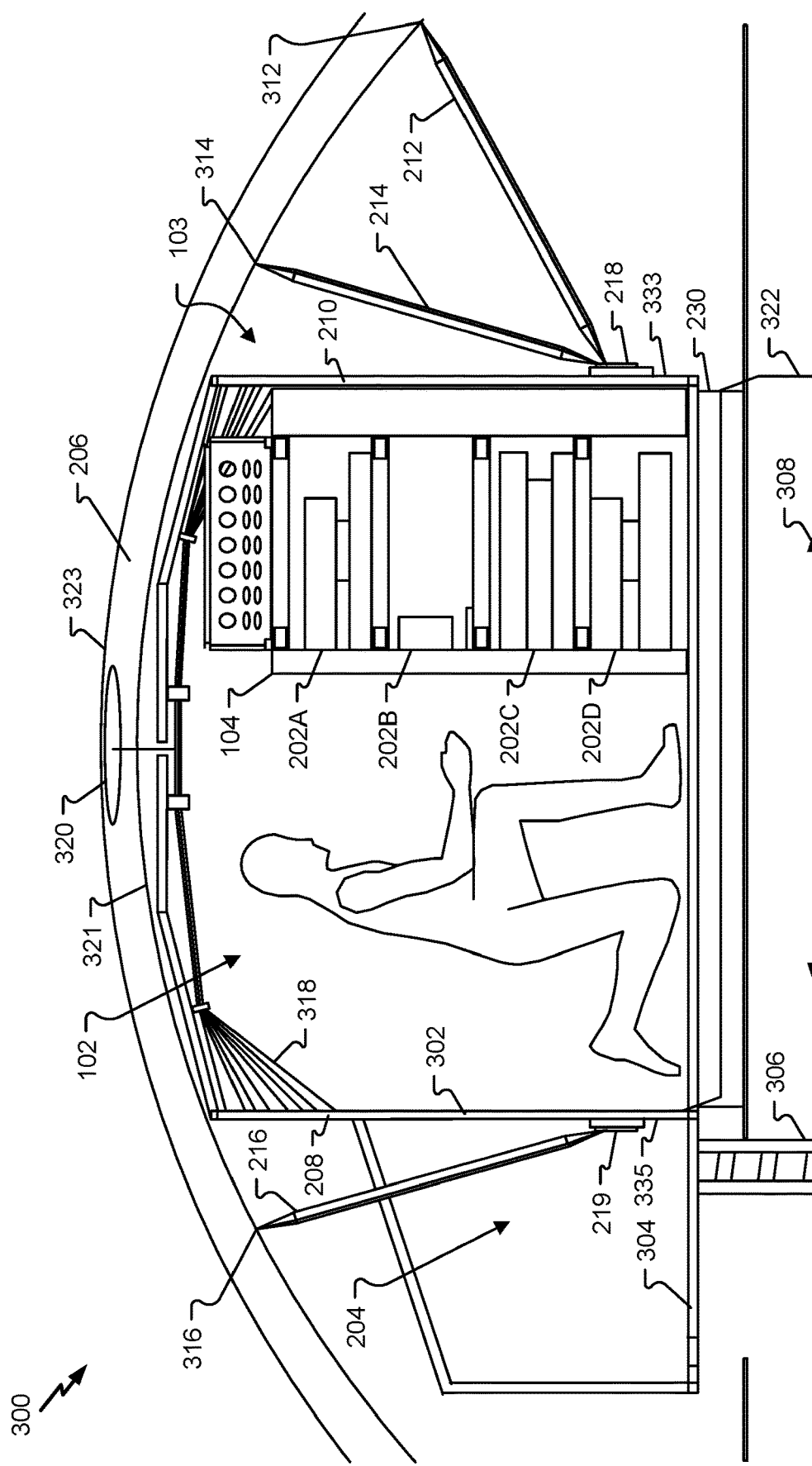
FIG. 3 illustrates a first view of the enclosure of FIG. 1.

Referring to FIG. 3, a first view 300 of the enclosure 102 of the aircraft 100 is depicted. The first view 300 represents a detailed view of the enclosure 102 from a similar direction to the view associated with FIG. 2. As illustrated in FIG. 3, the enclosure 102 is located above the passenger cabin 106. Further, the enclosure 102 extends in a direction perpendicular to the longitudinal axis 108 of the aircraft 100 (as illustrated in FIG. 1).

The enclosure 102 is coupled to the fuselage 206 of the aircraft 100. To illustrate, a first rail 218 is connected to an exterior 333 of the first side 210 of the enclosure 102 and a second rail 219 is connected to an exterior 335 of the second side 208 of the enclosure 102. The first rail 218 and the second rail 219 extend parallel to the longitudinal axis 108 of the aircraft 100. For example, the first rail 218 extends along the exterior 333 of the first side 210 of the enclosure 102 and the second rail 219 extends along the exterior 335 of the second side 208 of the enclosure 102. In a particular implementation, the first rail 218 and the second rail 219 extend along an entire length of the enclosure 102 (e.g., from a first end to a second end).

The first rail 218 and the second rail 219 are coupled to the fuselage 206 of the aircraft 100. To illustrate, a first set of coupling members are pivotably (e.g., rotatably) coupled to the first rail 218 and to the fuselage 206, and a second set of coupling members are pivotably (e.g., rotatably) coupled to the second rail 219 and to the fuselage 206. In FIG. 3, the first set of coupling members includes the first coupling member 212 and the second coupling member 214, and the second set of coupling members includes the third coupling member 216. Although three coupling members are illustrated in FIG. 3, more than three coupling members can be included, as described with reference to FIGS. 4 and 5. Each of the coupling members 212-216 includes or corresponds to a tie-rod, a beam, a support, a rod, or another type of coupling members capable of being pivotably coupled to the first rail 218 or to the second rail 219 and to the fuselage 206. For example, the coupling members 212-216 can be coupled to the corresponding rail or to the fuselage 206 by a fastener, a coupler or coupling, or other connection that is capable of pivoting such that the enclosure 102 can slightly pivot (e.g., laterally) to account for changes in the fuselage 206 due to pressurization or other reasons. In this manner, the enclosure 102 does not detrimentally impact the fuselage 206 because any stiffness of the enclosure 102 is decoupled from the fuselage 206.

In a particular implementation, the second set of coupling members includes fewer coupling members than the first set of coupling members. In a particular implementation, the first set of coupling members includes twice as many coupling members as the second set of coupling members. For example, for each third coupling member 216 included in the second set of coupling members, the first set of coupling members includes the first coupling member 212 and the second coupling member 214. In at least some implementations, the coupling members 212-216 are all that couples the enclosure 102 to the fuselage 206. Accordingly, an entirety of a weight of the enclosure 102 (and everything within the enclosure 102, such as the equipment rack 104 and the electronic component 202) is distributed to the fuselage by the first rail 218, the second rail 219, the first set of coupling members (e.g., the first coupling member 212 and the second coupling member 214), and the second set of coupling members (e.g., the third coupling member 216).

In a particular implementation, the coupling members 212-216 are coupled to different locations with respect to the fuselage 206. For example, the second coupling member 214 is coupled to a second location 314 that is closer to a top (e.g., an apex) of the aircraft 100 than a first location 312 to which the first coupling member 212 is coupled. Stated another way, a first angle between the first side 210 of the enclosure 102 and the first coupling member 212 can be greater than a second angle between the first side 210 of the enclosure 102 and the second coupling member 214. The third coupling member 216 is coupled to a third location 316. The third location can be as close to the top of the fuselage 206 as the second location or can be a different distance to the top of the fuselage 206. Stated another way, a third angle between the second side 208 of the enclosure 102 and the third coupling member 216 can be the same as the first angle, the second angle, or neither. In this manner, the enclosure 102 is asymmetrically coupled to the fuselage 206.

Asymmetrically coupling the enclosure 102 to the fuselage 206 compensates for hoop stress in the fuselage 206. For example, pressurization or depressurization of the interior of the aircraft 100 can cause deflections, such as expansion and contractions, within the fuselage 206, which causes hoop stress. Asymmetrically coupling the enclosure 102 to the fuselage 206 results in matching forces at equilibrium, regardless of any expansions or contractions of the fuselage 206, without creating hard points within the structure. Stated another way, the asymmetric coupling avoids over-constraining the fuselage 206, regardless of any expansions or contractions of the fuselage 206. To illustrate, lateral reactions caused by the enclosure 102 are transferred primarily to one side of the fuselage 206 to prevent creation of a large, rigid structure. Preventing creation of a large, rigid structure enables the fuselage to release strain energy via deflection (as opposed to carrying higher stresses if the enclosure 102 were not asymmetrically coupled to the fuselage 206).

The enclosure 102 includes the equipment rack 104. Although a single equipment rack 104 is illustrated, the enclosure 102 can include multiple equipment racks, as illustrated in FIG. 1. In a particular implementation, the equipment rack 104 has a fixed size and has storage locations for various modular components. For example, in FIG. 3, the equipment rack 104 is configured to store electronic components 202A, 202B, 202C, and 202D. In some implementations, rack units (RU), vertical hole spacing, horizontal hole spacing, rack opening, and front panel width are standardized in an industry standard, such as an Electronic Industries Association (EIA) standard. The electronic components 202A-D can include one or more components of avionics systems configured to record information (e.g., altitude, airspeed, location, time, temperature, other measurements, or a combination thereof), communication systems (e.g., a transmitter, a receiver, a transceiver), entertainment systems (e.g., part of an in-flight entertainment system available to passengers in the passenger cabin 106), other components, or a combination thereof. The electronic components 202A-D can be installed or removed at various times, such as prior to installation of the equipment rack 104, during manufacture and assembly of the aircraft 100, prior to flight, during flight, or after flight (e.g., during service and/or maintenance of the aircraft 100), or at different times.

The equipment rack 104 is coupled to the first side 210 of the enclosure 102. For example, the equipment rack 104 can be coupled to the first side 210 of the enclosure 102 using screws, bolts, cords, clips, straps, or other means of coupling. The entryway 204 is on the second side 208 of the enclosure 102 that is opposite (e.g., diametrically opposite) to the first side 210 of the enclosure. In other implementations, the additional equipment rack(s) are coupled to the second side 208 of the enclosure 102. Additionally, or alternatively, additional equipment rack(s) can be coupled to a front side or a back side of the enclosure 102.

The entryway 204 includes a second enclosure coupled to the enclosure 102. The entryway 204 can be made of the same or different materials than the enclosure 102. For example, the entryway 204 can be made of metal, plastic, laminate, a composite material, another material, or a combination thereof. The entryway 204 extends from the second side 208 of the enclosure 102 in a direction perpendicular to the longitudinal axis 108 of FIG. 1. For example, the entryway 204 extends in a direction parallel to a lateral axis 308 that is perpendicular to the longitudinal axis 108 of FIG. 1.

The entryway 204 includes an entrance 302 to the second side 208 of the enclosure 102 and an entrance 304 to the passenger cabin 106. For example, the entrance 302 can include a first hatch, hinged doorway, panel, or opening that provides access to the enclosure 102, and the entrance 304 can include a second hatch, hinged doorway, panel, or opening that provides access to the passenger cabin 106. The entryway 204 provides an entrance to the enclosure 102 from the passenger cabin 106. To illustrate, a crew member can access the enclosure 102 by climbing through the entrance 304 into the entryway 204 and entering the enclosure 102 via the entrance 302 in the second side 208 of the enclosure 102. In a particular implementation, a ladder 306 or the like is provided to enable crew members to enter the entryway 204. Although a single entryway 204 is illustrated, there can be multiple entryways 204 to enable multiple points of entry to the enclosure 102.

The enclosure 102 also includes wiring 318. In some implementations, the enclosure 102 includes one or more raceways to route the wiring 318 to various locations. The wiring 318 can be used to electrically couple the electronic components 202A-D to various components and systems throughout the aircraft 100. For example, the wiring 318 can include connections between the electronic components 202A-D and a power supply of the aircraft 100. The wiring 318 can include a connection to an antenna 320 coupled to a surface 321 external to the crown 103 of the aircraft 100. In the illustrated implementation, the antenna 320 is shown below a skin of the aircraft 100, but in other implementations, other arrangements are possible such as an antenna that is mounted to an external surface of the aircraft 100. For example, the antenna 320 may be attached to a surface 323 of the fuselage 206 (e.g., a skin). The antenna 320 can be configured to be communicatively coupled to one or more satellites. The wiring 318 can include connections between the electronic components 202A-D and the antenna 320. For example, the enclosure 102 can include an opening, and one or more wires can be routed through the opening to the antenna 320. Alternatively, the wiring 318 can include one or more wires that are routed outside an edge of the enclosure 102 to the antenna 320. In a particular implementation, the electronic components 202A-D include a receiver, a transmitter, or a combination thereof (e.g., a transceiver) configured to communicate with one or more satellites via the antenna 320. Thus, the antenna 320 provides communication services, Internet access, etc., to at least some of the electronic components 202A-D.

Additionally, or alternatively, the wiring 318 can include wiring to connect the electronic components 202A-D to components or systems within the cockpit, within the passenger cabin 106, or both. As an example, the electronic components 202A-D can include one or more avionics components, and the wiring 318 can include one or more wires routed to the cockpit to connect the avionics components to systems in the cockpit. As another example, the electronic components 202A-D can include one or more components to be coupled to components or systems within the passenger cabin 106, and the wiring 318 can include one or more wires routed to the passenger cabin 106. To illustrate, the wiring 318 can include a set of wires 322 that are routed out of the enclosure 102 and to the passenger cabin 106. The set of wires 322 connects the electronic components 202A-D to one or more components within the passenger cabin 106, such as the entertainment system 226 of FIG. 2. In a particular implementation, the set of wires 322 extends across a width of the enclosure 102 within the spacer panel 230.

In this manner, the enclosure 102 depicted in FIGS. 2 and 3 enables storage of the equipment racks 104 and the electronic components 202 in space above the passenger cabin 106 instead of being stored in an electronics and equipment bay within the passenger cabin 106. The enclosure 102 efficiently uses space that can otherwise go unused or be used to route wires and ducts throughout the aircraft 100. Storing the electronic components 202 in the enclosure 102 above the passenger cabin 106 can free up space in the passenger cabin 106 to be used for other revenue-increasing purposes, such as additional seats, additional aisles, additional cargo space, additional features, other uses, or a combination thereof. Because the area above the passenger cabin 106 is pressurized and climate-controlled, the enclosure 102 can serve as a pressurized and climate-controlled electronics bay. Additionally, when some of the electronic components 202 are coupled to the antenna 320 that is coupled to an exterior of the crown 103 of the aircraft 100, the length and complexity of wiring is reduced because the electronic components 202 are closer to the top of the aircraft 100 (as compared to if the electronic components 202 are stored in a bay within the passenger cabin 106). Similarly, the electronic components 202 that are coupled to components or systems within the passenger cabin 106 can be located above the corresponding components or systems, which can further reduce the amount (and therefore weight) of wiring and the complexity of routing within the aircraft 100.

Figure 5:
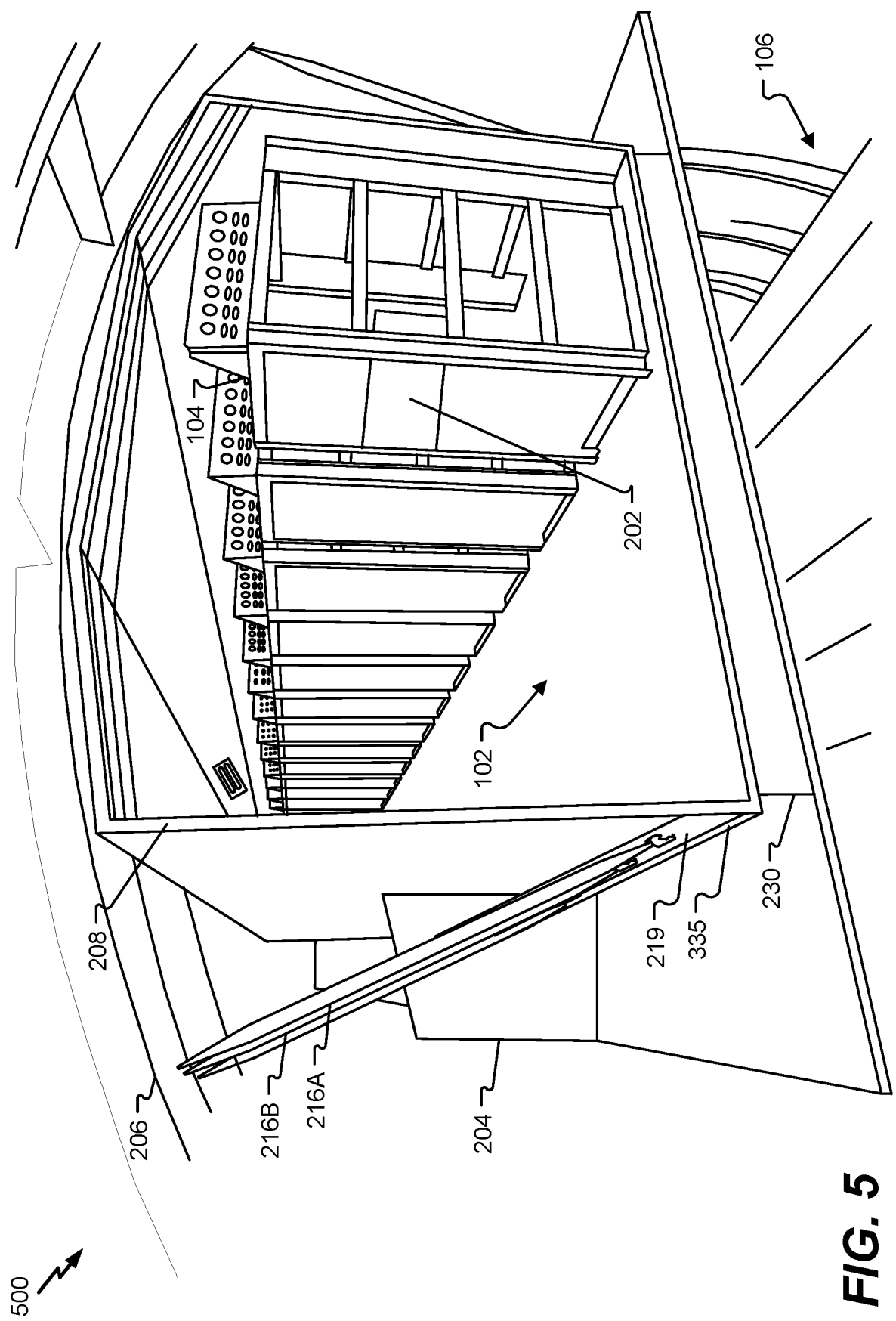
FIG. 5 illustrates a third view of the enclosure of FIG. 1.

Referring to FIGS. 4 and 5, two views 400 and 500 of the enclosure 102 are shown. As illustrated in FIG. 4, the enclosure 102 includes the equipment rack 104 that stores the electronic component 202. Although a single equipment rack 104 is shown in FIG. 4, multiple equipment racks can be stored within the enclosure 102, as depicted in FIG. 5. In a particular implementation, the multiple equipment racks 104 have a fixed size and are configured to store modular components. In other implementations, one or more of the equipment racks 104 can have a different size or configuration. For example, equipment racks for storing avionics components can be different than equipment racks for storing communication components or entertainment system components, as non-limiting examples. Although the equipment rack 104 is illustrated in FIGS. 4 and 5 as being coupled to the first side 210 of the enclosure 102, in other implementations, additional equipment rack(s) are coupled to the second side 208 of the enclosure 102.

The enclosure 102 also includes the wiring 318 that is used to connect the electronic component 202 to one or more other components or systems throughout the aircraft 100. For example, the wiring 318 can connect the electronic component 202 to power, to ground, to an antenna coupled to an exterior of the crown 103 of the aircraft 100, to a component or system within the passenger cabin 106, to other electronic components within the enclosure 102, to other systems, or a combination thereof.

As illustrated in FIG. 4, the enclosure 102 includes one or more environmental control system (ECS) ducts 402. The ECS ducts 402 are coupled to ECS ducts within the aircraft 100 and are configured to provide cool air to the enclosure 102, to vent warm air from the enclosure 102, or both. Providing cool air to the enclosure 102 can assist in preventing overheating of the electronic component 202. In a particular implementation, ducts or ports configured to provide cool are located along a ceiling of the enclosure 102 close to the second side 208 and pointed toward the equipment racks 104, and ducts or ports configured to vent the warm air are located along the first side 210 (behind the equipment racks 104).

In the examples illustrated in FIGS. 4 and 5, the enclosure 102 is coupled to the fuselage 206 by multiple coupling members. For example, as illustrated in FIG. 4, multiple first coupling members 212A and 212B are coupled to the first rail 218 and to the fuselage 206. The first coupling member 212A is coupled to the first rail 218 at a first location, the first coupling member 212B is coupled to the first rail 218 at a second location, and other first coupling members are coupled to the first rail 218 at other locations along the first rail 218. Additionally, multiple second coupling members 214A and 214B are coupled to the first rail 218 and to the fuselage 206. The second coupling member 214A is coupled to the first rail 218 at the first location, the second coupling member 214B is coupled to the first rail 218 at the second location, and other second coupling members are coupled to the first rail 218 at other locations along the first rail 218. As another example, as illustrated in FIG. 5, multiple third coupling members 216A and 216B are coupled to the second rail 219 and to the fuselage 206. The third coupling member 216A is coupled to the second rail 219 at a third location, the third coupling member 216B is coupled to the second rail 219 at a fourth location, and other third coupling members are coupled to the second rail 219 at other locations along the second rail 219.

As described with reference to FIG. 3, the enclosure 102 can be asymmetrically coupled to the fuselage 206. For example, the second coupling members 214A-B can be coupled to locations of the fuselage 206 that are closer to the top (e.g., an apex) of the fuselage 206 than locations to which the first coupling members 212A-B are coupled. The third coupling members 216A-B can be coupled to locations that are the same distance from the top as the first coupling members 212A-B, as the second coupling members 214A-B, or that are different than both. To further illustrate, first angles between the first side 210 of the enclosure 102 and the first coupling members 212A-B are different than second angles between the first side 210 and the second coupling members 214A-B. Third angles between the second side 208 of the enclosure 102 and the third coupling members 216A-B can be the same as the first angles, the same as the second angles, or can be different than both. Coupling the enclosure 102 to the fuselage 206 in this manner helps to compensate for hoop stress in the fuselage 206, such as hoop stress (and/or expansions or contractions) caused by pressurization or de-pressurization of the fuselage 206.

Figure 6:
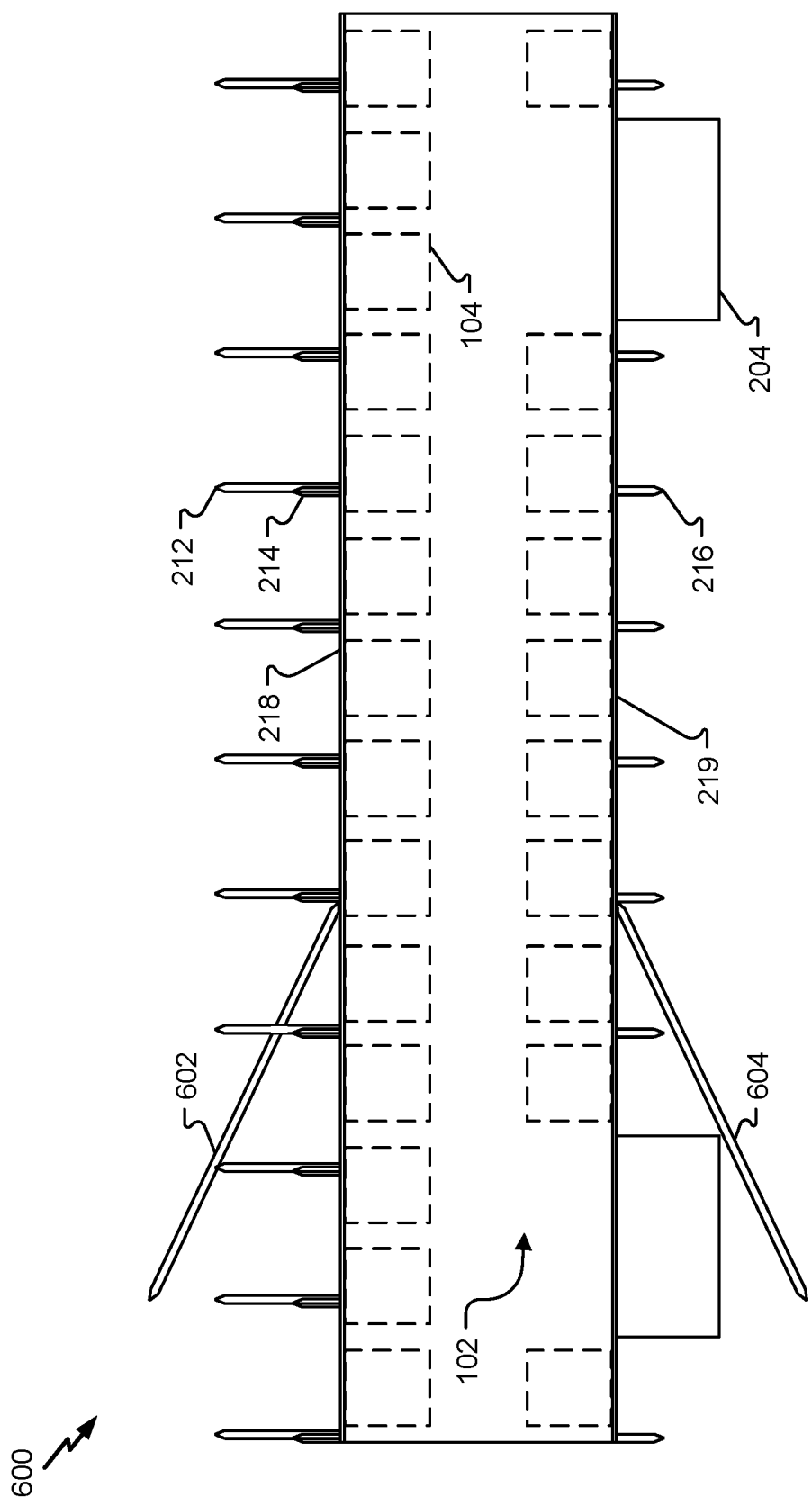
FIG. 6 illustrates a fourth view of the enclosure of FIG. 1.

Referring to FIG. 6, a view 600 of the enclosure 102 is shown. FIG. 6 illustrates a top-down view of the enclosure 102. The enclosure 102 stores the equipment rack 104 along a first side of the enclosure, and the entryway 204 is along the second side of the enclosure 102. Additional equipment racks 104 are located along the first side of the enclosure 102 and along the second side of the enclosure 102. In other implementations, the equipment racks 104 are located along a single side of the enclosure 102. As illustrated in FIG. 6, the enclosure 102 includes the first rail 218 and the second rail 219, the first rail 218 is coupled to the fuselage 206 via the first coupling member 212 and the second coupling member 214, and the second rail 219 is coupled to the fuselage 206 via the third coupling member 216. Additionally, the enclosure 102 is coupled to sides of the fuselage 206 by support members. To illustrate, in the example of FIG. 6, the enclosure 102 is coupled to a first side of the fuselage 206 by a first support member 602, and the enclosure 102 is coupled to a second side of the fuselage 206 by a second support member 604. The first support members 602 and the second support member 604 include or correspond to tie-rods, beams, supports, rods, or other types of coupling members. The first support member 602 and the second support member 604 are configured to reduce or prevent motion of the enclosure 102 in a direction parallel to the longitudinal axis 108 of FIG. 1 (e.g., nose-to-tail motion).

Figure 7:
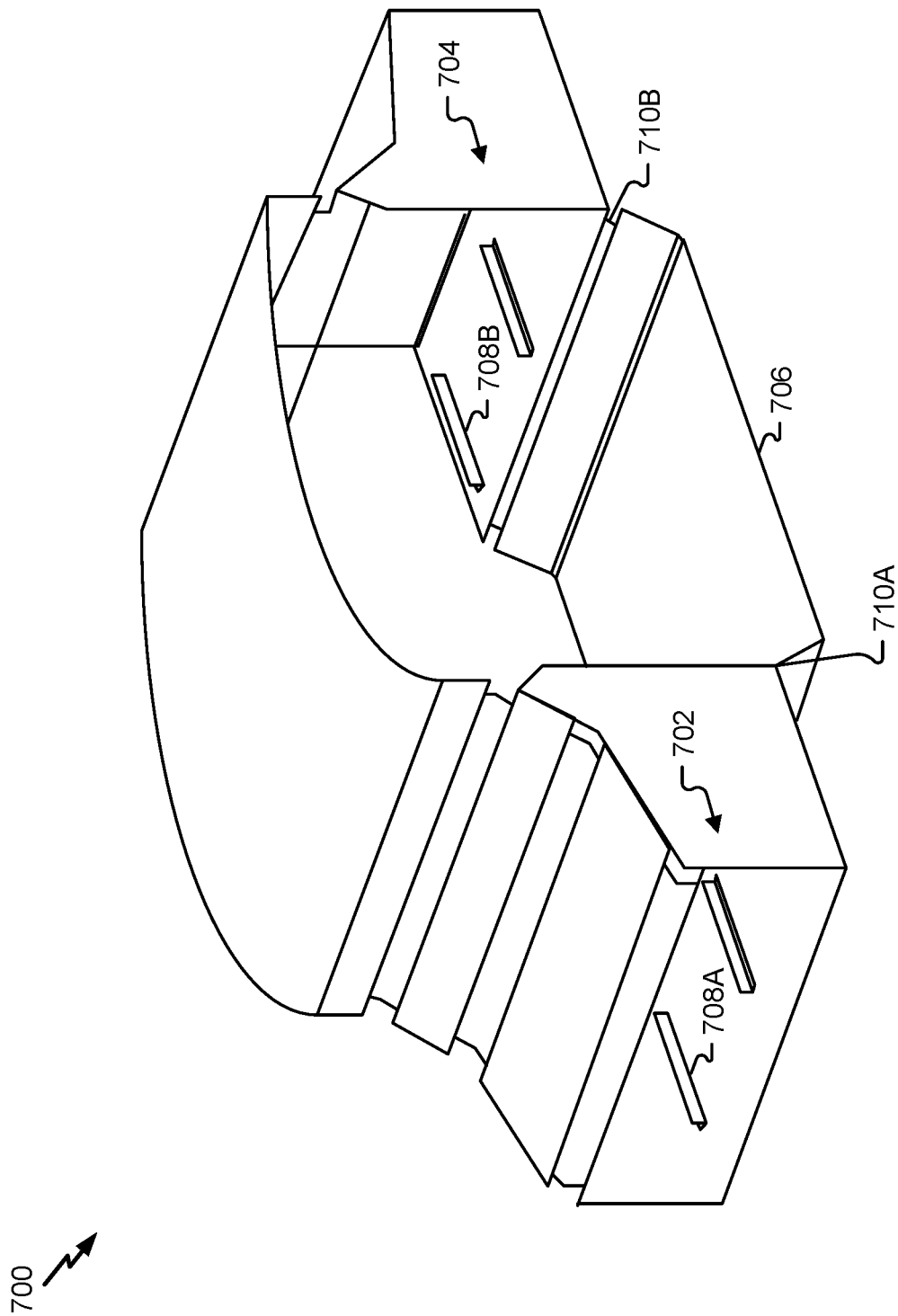
FIG. 7 illustrates a particular implementation of a module of the enclosure of FIG. 1.

Referring to FIG. 7, a module 700 of the enclosure 102 of FIG. 1 is shown. In a particular implementation, the enclosure 102 is made up of a plurality of the modules 700. In the example illustrated in FIG. 7, the module 700 includes a left module 702 and a right module 704. A floor assembly 706 separates the left module 702 and the right module 704. Each of the left module 702 and the right module 704 is configured to store the equipment racks 104 of FIGS. 1-6. To illustrate, the left module 702 includes guide rails 708A to enable installation of the equipment rack 104, and the right module 704 includes guide rails 708B to enable installation of the equipment rack 104. Two guide rails 708A and 708B are illustrated for convenience, however, in some implementations, the left module 702 and the right module 704 each include four guiderails 708 such that two equipment racks 104 are able to be installed in each of the left module 702 and the right module 704. In other implementations, one of the left module 702 or the right module 704 is replaced with the entryway 204. Additionally, the module 700 includes pivot joints 710A and 710B that enable the module 700 to pivot laterally (with respect to the aircraft 100) such that the module 700 is able to compensate for changes in the fuselage 206, such as due to expansion or contraction during pressurization or de-pressurization.

Figure 8:
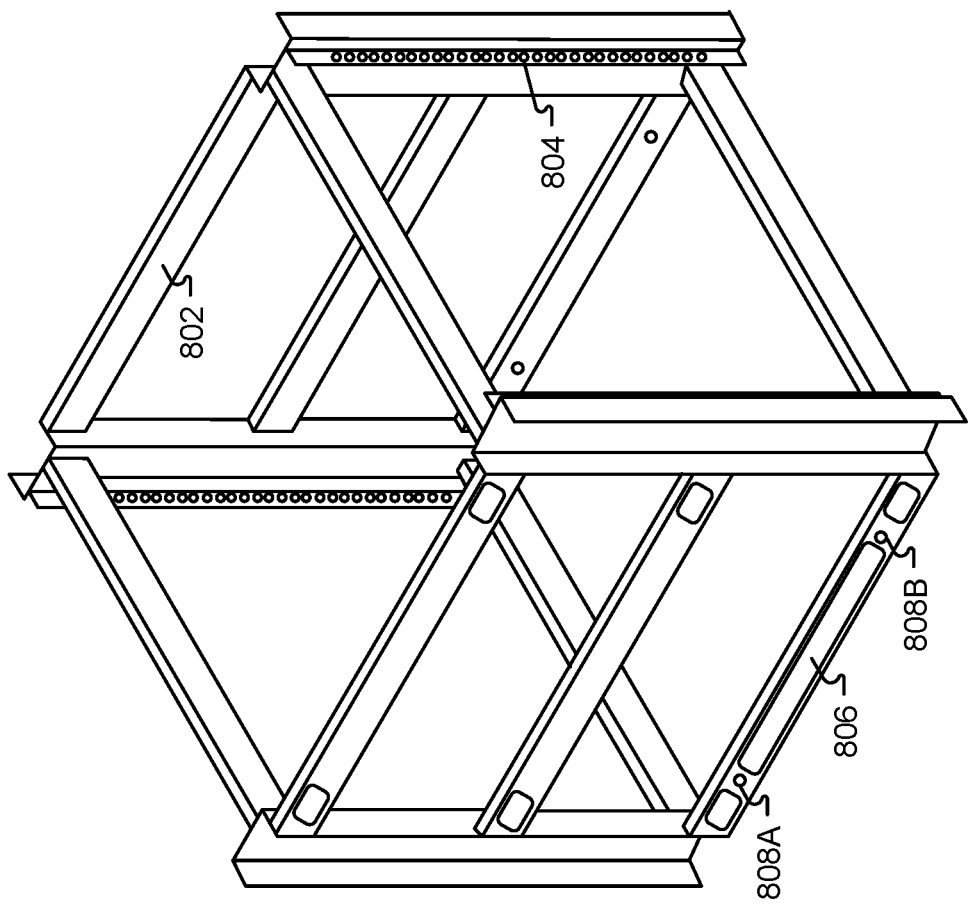
FIG. 8 illustrates a particular implementation of the equipment rack of FIG. 1.

Referring to FIG. 8, an example of the equipment rack 104 of FIG. 1 is shown. In a particular implementation, the equipment rack 104 has a fixed size and has storage locations for various modular components. For example, rack units (RU), vertical hole spacing, horizontal hole spacing, rack opening, and front panel width can be standardized in an industry standard, such as an Electronic Industries Association (EIA) standard. The equipment rack 104 includes a plurality of members 802 configured to define the equipment rack 104 and to store one or more electronic components. In the example illustrated in FIG. 8, the equipment rack 104 includes a plurality of holes 804. The plurality of holes 804 can be used to screw in various electronic components that are housed within the equipment rack 104. In a particular implementation, the holes are separated by a fixed amount of spacing that is standardized in one or more industry standards. The equipment rack 104 also includes a slide rail 806 and shear pins 808A and 808B. The slide rail 806 can enable installation of the equipment rack 104 within the enclosure 102, such as via connection with the guiderails 708 of FIG. 7. The shear pins 808A and 808B can prevent motion of the equipment rack 104 due to pivoting of the enclosure 102. As previously described, the equipment rack 104 is configured to store one or more modular electronics components, such as avionics components, entertainment system components, communication components, other components, or a combination thereof.

FIG. 9 illustrates a method 900 of removing an electronic component within the enclosure 102 of FIG. 1. The method 900 includes accessing an enclosure positioned in a crown of an aircraft and extending in a direction parallel to a longitudinal axis of the aircraft, at 902. The crown is above a passenger cabin of the aircraft. The enclosure includes an equipment rack coupled to a first side of the enclosure. The equipment rack stores an electronic component. The enclosure further has an entryway on a second side of the enclosure that is opposite to the first side. The entryway provides access to the enclosure from the passenger cabin. For example, the enclosure can include or correspond to the enclosure 102 of FIGS. 1-5, the passenger cabin can include or correspond to the passenger cabin 106 of FIGS. 1-5, the equipment rack can include or correspond to the equipment rack 104 of FIGS. 1-5, the electronic component can include or correspond to the electronic component 202 of FIGS. 2-5, and the entryway can include or correspond to the entryway 204 of FIGS. 2-3 and 5. To illustrate, a crew member or technician can access the enclosure 102 from the passenger cabin 106 via the entryway 204.

The method 900 also includes removing the electronic component from the equipment rack, at 904. For example, a crew member or technician can remove the electronic component 202 during service or maintenance, during retrofitting, or at another time.

In a particular implementation, the method 900 includes decoupling the electronic component from a power supply, from a system within the aircraft, from an antenna on an exterior of the aircraft, or a combination thereof. For example, a crew member or technician can access the enclosure 102 to decouple the electronic component 202 from one or more connections prior to removing the electronic component 202. In another particular implementation, the method 900 includes reconfiguring a second electronic component stored within the equipment rack. For example, a crew member or technician can access the enclosure 102 to adjust a setting, to update, to adjust a coupling to, or to otherwise modify an operation or state of an electronic component.

FIG. 10 illustrates a method 1000 of installing an electronic component within the enclosure 102 of FIG. 1. The method 1000 includes accessing an enclosure positioned in a crown of an aircraft and extending in a direction parallel to a longitudinal axis of the aircraft, at 1002. The crown is above a passenger cabin of the aircraft. The enclosure includes an equipment rack coupled to a first side of the enclosure. The enclosure further has an entryway on a second side of the enclosure that is opposite to the first side. The entryway provides access to the enclosure from the passenger cabin. For example, the enclosure can include or correspond to the enclosure 102 of FIGS. 1-5, the passenger cabin can include or correspond to the passenger cabin 106 of FIGS. 1-5, the equipment rack can include or correspond to the equipment rack 104 of FIGS. 1-5, and the entryway can include or correspond to the entryway 204 of FIGS. 2-3 and 5. To illustrate, a crew member or technician can access the enclosure 102 from the passenger cabin 106 via the entryway 204.

The method 1000 also includes installing an electronic component within the equipment rack, at 1004. For example, a crew member or technician can install the electronic component 202 during manufacture, during flight, during service or maintenance, or at another time.

In a particular implementation, the method 1000 includes electrically coupling the electronic component to an antenna coupled to an exterior of the crown of the aircraft. For example, a crew member or technician can electrically couple the electronic component 202 to the antenna 320. In another particular implementation, the method 1000 includes electrically coupling the electronic component to an entertainment system within the passenger cabin. For example, a crew member or technician can electrically couple the electronic component 202 to the entertainment system 226 in the passenger cabin 106. In another particular implementation, the method 1000 includes electrically coupling the electronic component to a power supply of the aircraft.

Figure 11:
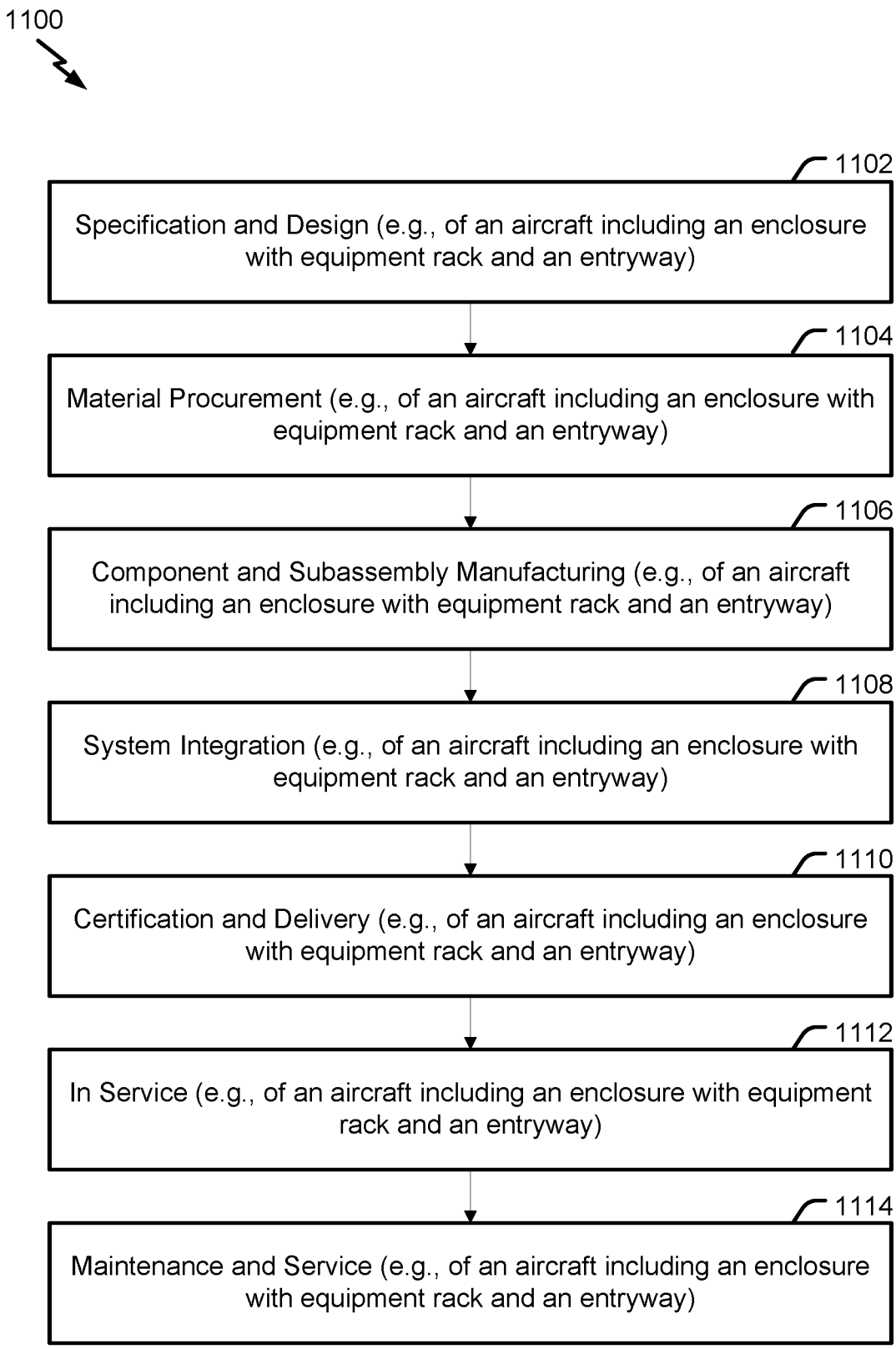
FIG. 11 is a flow chart illustrating aspects of a life cycle of an aircraft including the enclosure of FIG. 1.
Figure 12:
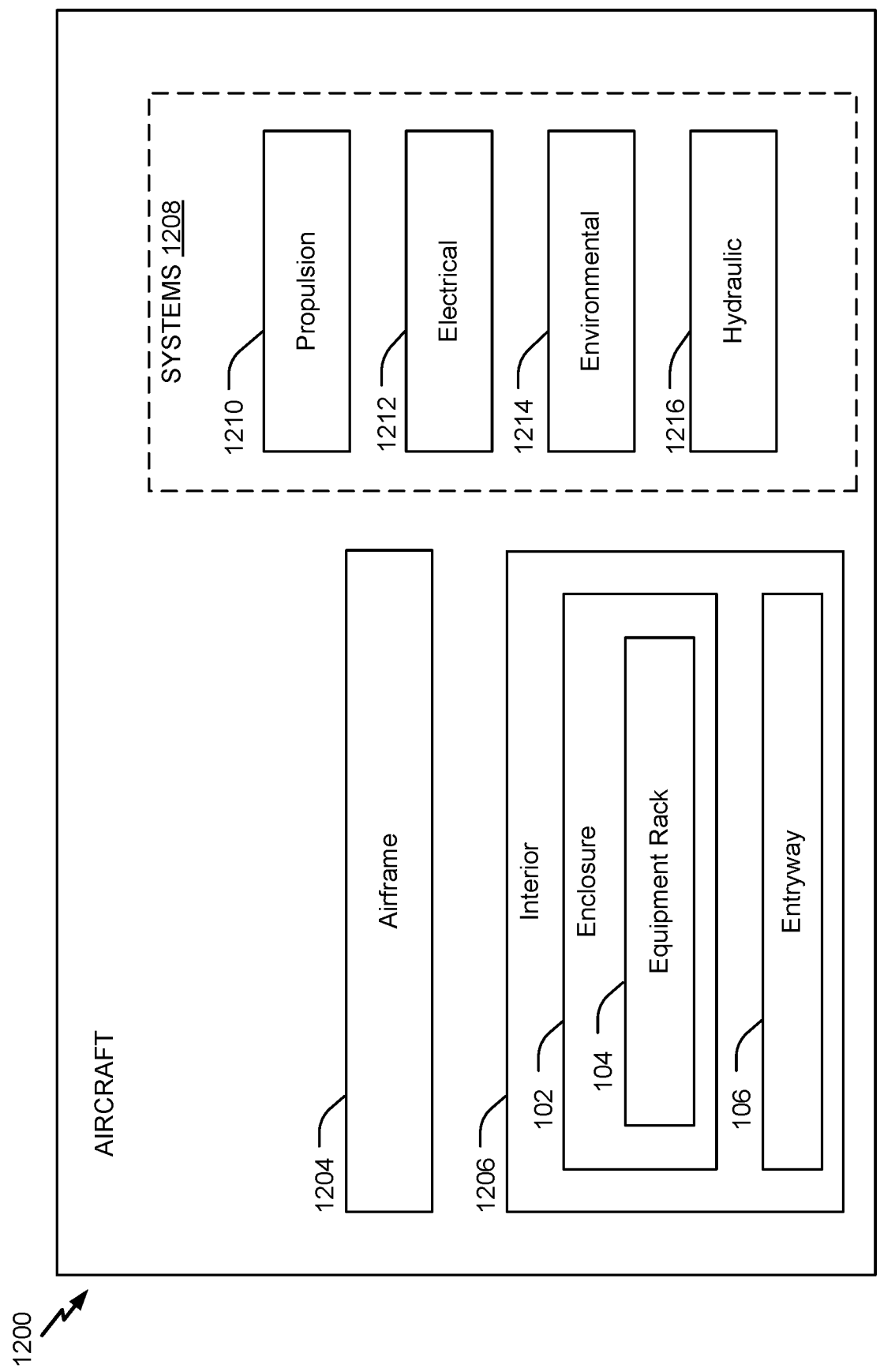
FIG. 12 is a block diagram of an aircraft including the enclosure of FIG. 1.

Referring to FIGS. 11 and 12, examples of the disclosure are described in the context of an aircraft manufacturing and service method 1100 as illustrated by the flow chart of FIG. 11 and an aircraft 1200 as illustrated by the block diagram of FIG. 12. In a particular implementation, the aircraft 1200 includes or corresponds to the aircraft 100 of FIG. 1.

In FIG. 11, the method 1100 includes several stages before, during, and after production of the aircraft 1200. During pre-production, the exemplary method 1100 includes, at 1102, specification and design of the aircraft 1200. During the specification and design of the aircraft 1200, the method 1100 can include specifying the design and/or placement of the enclosure 102 and the entryway 204. Further during pre-production, at 1104, the method 1100 includes material procurement. For example, materials for the enclosure 102 and the entryway 204 can be procured based on the specification and design.

During production, the method 1100 includes, at 1106, component and subassembly manufacturing and, at 1108, system integration of the aircraft 1200. For example, component and subassembly manufacturing can include forming the enclosure 102 and the entryway 204, and installation of the equipment rack 104 within the enclosure 102. In some implementations, at least one electronic component is installed within the equipment rack 104 during component and subassembly manufacturing. In these implementations, system integration can include electrically connecting the at least one component to other systems of the aircraft 1200.

At 1110, the method 1100 includes certification and delivery of the aircraft 1200 and, at 1112, placing the aircraft 1200 in service. For example, the aircraft 1200, including the enclosure 102, the equipment rack 104, and the entryway 204, can be tested against relevant aviation standards and regulations in order to certify the aircraft 1200.

While in service by a customer, the aircraft 1200 can be scheduled for maintenance and service (which can also include modification, reconfiguration, refurbishment, and so on). At 1114, the method 1100 includes performing maintenance and service on the aircraft 1200. Performing maintenance and service on the aircraft 1200 can include performing maintenance and service one or more electronic components coupled to the equipment rack 104 within the enclosure 102. For example, the enclosure 102 can be accessed via the entryway 204 to perform maintenance and service at least one electronic component within the equipment rack 104. Service and maintenance can include reconfiguring the at least one electronic component, removing the at least one electronic component, replacing the at least one electronic component, installing an additional electronic component within the equipment rack 104, or a combination thereof. As another example, maintenance and service of the aircraft 1200 can include installing the equipment rack 104 (e.g., coupling the equipment rack 104 to the enclosure 102), installing at least one electronic component within the equipment rack, or a combination thereof. In some implementations, the equipment rack 104 can be pre-installed with at least one electronic component.

Each of the processes of the method 1100 can be performed or carried out by a system integrator, a third party, and/or an operator (e.g., a customer). For the purposes of this description, a system integrator includes without limitation any number of vehicle manufacturers and major-system subcontractors; a third party can include without limitation any number of vendors, subcontractors, and suppliers; and an operator can be an airline, leasing company, military entity, service organization, and so on.

Referring to FIG. 12, a block diagram of an illustrative implementation of the aircraft 1200 that includes the enclosure 102 and the entryway 204 is shown. In at least one implementation, the aircraft 1200 is produced by at least a portion of the method 1100 of FIG. 11. In the example shown in FIG. 12, the aircraft 1200 includes an airframe 1204, an interior 1206, and a plurality of systems 1208. Examples of the plurality of systems 1208 include one or more of a propulsion system 1210, an electrical system 1212, an environmental system 1214, or a hydraulic system 1216. In FIG. 12, the interior 1206 also includes the enclosure 102 and the entryway 204. In a particular implementation, the enclosure 102 is positioned in a crown of the aircraft 1200 and extends in a direction parallel to a longitudinal axis of the aircraft 1200. In this implementation, the equipment rack 104 is coupled to a first side of the enclosure and configured to hold at least one electronic component. In this implementation, the entryway 204 is on a second side of the enclosure 102 that is opposite to the first side. In another particular implementation, interior 1206 includes the enclosure 102. In this implementation, the interior 1206 includes a first rail connected to an exterior of a first side of the enclosure and extending parallel to a longitudinal axis of the aircraft 1200 and a second rail connected to an exterior of a second side of the enclosure and extending parallel to the longitudinal axis of the aircraft 1200. In this implementation, the interior 1206 further includes a first set of coupling members coupling the first rail to a fuselage of the aircraft 1200 and a second set of coupling members coupling the second rail to the fuselage.

Apparatus and methods included herein can be employed during any one or more of the stages of the method 1100 of FIG. 11. For example, components or subassemblies corresponding to production process 1108 can be fabricated or manufactured in a manner similar to components or subassemblies produced while the aircraft 1200 is in service, at 1112 for example and without limitation. Also, one or more apparatus implementations, method implementations, or a combination thereof can be utilized during the production stages (e.g., stages 1102-1110 of the method 1100), for example, by substantially expediting assembly of or reducing the cost of the aircraft 1200. Similarly, one or more of apparatus implementations, method implementations, or a combination thereof can be utilized while the aircraft 1200 is in service, for example while maintenance and service is performed on the aircraft 1200, at 1114.

Although one or more of FIGS. 1-12 illustrate systems, apparatuses, and/or methods according to the teachings of the disclosure, the disclosure is not limited to these illustrated systems, apparatuses, and/or methods. One or more functions or components of any of FIGS. 1-12 as illustrated or described herein can be combined with one or more other portions of another of FIGS. 1-12. For example, one or more elements of the method 900 of FIG. 9 can be performed in combination with one or more elements of the method 1000 of FIG. 10, the method 1100 of FIG. 11, or with other operations described herein. Accordingly, no single implementation described herein should be construed as limiting and implementations of the disclosure can be suitably combined without departing form the teachings of the disclosure. As an example, one or more operations described with reference to FIGS. 9-11 can be optional, can be performed at least partially concurrently, and/or can be performed in a different order than shown or described.

The illustrations of the examples described herein are intended to provide a general understanding of the structure of the various implementations. The illustrations are not intended to serve as a complete description of all of the elements and features of apparatus and systems that utilize the structures or methods described herein. Many other implementations can be apparent to those of skill in the art upon reviewing the disclosure. Other implementations can be utilized and derived from the disclosure, such that structural and logical substitutions and changes can be made without departing from the scope of the disclosure. For example, method operations can be performed in a different order than shown in the figures or one or more method operations can be omitted. Accordingly, the disclosure and the figures are to be regarded as illustrative rather than restrictive.

Moreover, although specific examples have been illustrated and described herein, it should be appreciated that any subsequent arrangement designed to achieve the same or similar results can be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features can be grouped together or described in a single implementation for the purpose of streamlining the disclosure. Examples described above illustrate but do not limit the disclosure. It should also be understood that numerous modifications and variations are possible in accordance with the principles of the present disclosure. As the following claims reflect, the claimed subject matter can be directed to less than all of the features of any of the disclosed examples. Accordingly, the scope of the disclosure is defined by the following claims and their equivalents.

What is claimed is:

1. An aircraft comprising:
    an enclosure positioned in a crown of the aircraft and extending in a direction parallel to a longitudinal axis of the aircraft, the crown being above a passenger cabin of the aircraft;
    an equipment rack coupled to a first side of the enclosure, the equipment rack configured to hold at least one electronic component; and
    an entryway on a second side of the enclosure that is opposite to the first side, the entryway providing access to the enclosure from the passenger cabin.

2. The aircraft of claim 1, further comprising an antenna coupled to an exterior surface of the crown, wherein an electronic component of the at least one electronic component is electrically coupled to the antenna, and wherein the electronic component comprises a receiver, a transmitter, or a combination thereof.

3. The aircraft of claim 1, further comprising at least a second equipment rack coupled to the second side of the enclosure.

4. The aircraft of claim 1, wherein the equipment rack comprises a modular equipment rack having a standardized size.

5. The aircraft of claim 1, further comprising:
    a first rail connected to an exterior of the first side of the enclosure, the first rail extending in a direction parallel to the longitudinal axis of the aircraft; and
    a second rail connected to an exterior of the second side of the enclosure, the second rail extending in the direction parallel to the longitudinal axis of the aircraft.

6. The aircraft of claim 5, further comprising:
    a first set of coupling members pivotably coupled to the first rail and to a fuselage of the aircraft; and
    a second set of coupling members pivotably coupled to the second rail and to the fuselage.

7. The aircraft of claim 6, wherein the second set of coupling members includes fewer coupling members than the first set of coupling members.

8. The aircraft of claim 6, wherein an entirety of a weight of the enclosure, the equipment rack, and the electronic component is distributed to the fuselage via the first rail and the second rail.

9. The aircraft of claim 6, wherein the first side and the second side are diametrically opposed to one another, wherein a first coupling member of the first set of coupling members is pivotably coupled to the fuselage at a first location, wherein a second coupling member of the second set of coupling members is pivotably coupled to the fuselage at a second location, and wherein the second location is closer to a top of the fuselage than the first location.

10. The aircraft of claim 1, further comprising a spacer panel connected to a bottom of the enclosure, wherein the spacer panel is positioned between the enclosure and the passenger cabin, and wherein the spacer panel is configured to enable one or more connectors to extend across a width of the enclosure.

11. The aircraft of claim 1, further comprising one or more overhead components within the passenger cabin and one or more overhead storage bins, wherein the one or more overhead components include a light, a fan, an indicator, or a combination thereof.

12. The aircraft of claim 1, further comprising one or more environmental control system (ECS) vents configured to deliver air to and from the enclosure.

13. The aircraft of claim 1, wherein the entryway comprises a second enclosure coupled to the enclosure and extending in a direction perpendicular to the longitudinal axis of the aircraft, wherein the entryway includes an entrance to the second side of the enclosure and an entrance to the passenger cabin.

14. A method comprising:
    accessing an enclosure positioned in a crown of an aircraft and extending in a direction parallel to a longitudinal axis of the aircraft, the crown being above a passenger cabin of the aircraft, the enclosure having an equipment rack coupled to a first side of the enclosure, the equipment rack storing an electronic component, the enclosure further having an entryway on a second side of the enclosure that is opposite to the first side, the entryway providing access to the enclosure from the passenger cabin; and removing the electronic component from the equipment rack.

15. The method of claim 14, further comprising electrically decoupling the electronic component from a power supply, from a system within the aircraft, from an antenna on an exterior of the aircraft, or a combination thereof, prior to removing the electronic component.

16. The method of claim 14, wherein the enclosure is accessed from the passenger cabin.

17. A method comprising:
   accessing an enclosure positioned in a crown of an aircraft and extending in a direction parallel to a longitudinal axis of the aircraft, the crown being above a passenger cabin of the aircraft, the enclosure having an equipment rack coupled to a first side of the enclosure, the enclosure further having an entryway on a second side of the enclosure that is opposite to the first side, the entryway providing access to the enclosure from the passenger cabin; and
   installing an electronic component within the equipment rack.

18. The method of claim 17, further comprising electrically coupling the electronic component to an antenna coupled to an exterior of the crown of the aircraft.

19. The method of claim 17, further comprising electrically coupling the electronic component to an entertainment system within the passenger cabin.

20. The method of claim 17, further comprising electrically coupling the electronic component to a power supply of the aircraft.

\* \* \* \* \*